United States Patent
Kataoka

(10) Patent No.: US 8,557,067 B2
(45) Date of Patent: Oct. 15, 2013

(54) METHOD FOR MANUFACTURING ORGANIC ELECTROLUMINESCENCE PANEL

(75) Inventor: Ichiro Kataoka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 751 days.

(21) Appl. No.: 12/035,057

(22) Filed: Feb. 21, 2008

(65) Prior Publication Data

US 2008/0220151 A1 Sep. 11, 2008

(30) Foreign Application Priority Data

Mar. 7, 2007 (JP) ................................. 2007-057244

(51) Int. Cl.
B05D 5/12 (2006.01)

(52) U.S. Cl.
USPC .............. 156/60; 427/66; 156/250; 156/252; 156/253

(58) Field of Classification Search
USPC .................... 156/60, 250, 252, 253
See application file for complete search history.

(56) References Cited

U.S. PATENT DOCUMENTS

| | | | |
|---|---|---|---|
| 6,891,325 B1 * | 5/2005 | Nice et al. | 313/504 |
| 2004/0189196 A1 * | 9/2004 | Cok | 313/512 |
| 2007/0138949 A1 * | 6/2007 | Yoshida et al. | 313/504 |
| 2007/0145889 A1 * | 6/2007 | Tamura et al. | 313/504 |
| 2007/0284768 A1 * | 12/2007 | Takahashi et al. | 264/1.34 |

FOREIGN PATENT DOCUMENTS

| | | | |
|---|---|---|---|
| JP | 2003-051380 A | | 2/2003 |
| JP | 2003-223111 A | | 8/2003 |
| JP | 2003234179 A | * | 8/2003 |
| JP | 2003-249354 | | 9/2003 |
| JP | 2003249354 A | * | 9/2003 |
| JP | 2005109482 A | * | 4/2005 |
| JP | 2006-171454 A | | 6/2006 |

OTHER PUBLICATIONS

Japanese Office Action issued in corresponding application No. 2007-057244 dated Jan. 31, 2012—4 pages.

* cited by examiner

Primary Examiner — Philip Tucker
Assistant Examiner — Vicki Wu
(74) Attorney, Agent, or Firm — Fitzpatrick, Cella, Harper & Scinto

(57) ABSTRACT

A substrate, an array of organic electroluminescence element groups disposed on the substrate, each organic electroluminescence element group formed of a plurality of organic electroluminescence elements, a protective layer disposed on the array of organic electroluminescence element groups, and a laminate member disposed on the protective layer were divided between the array of organic electroluminescence element groups into a plurality of organic electroluminescence panels.

6 Claims, 3 Drawing Sheets

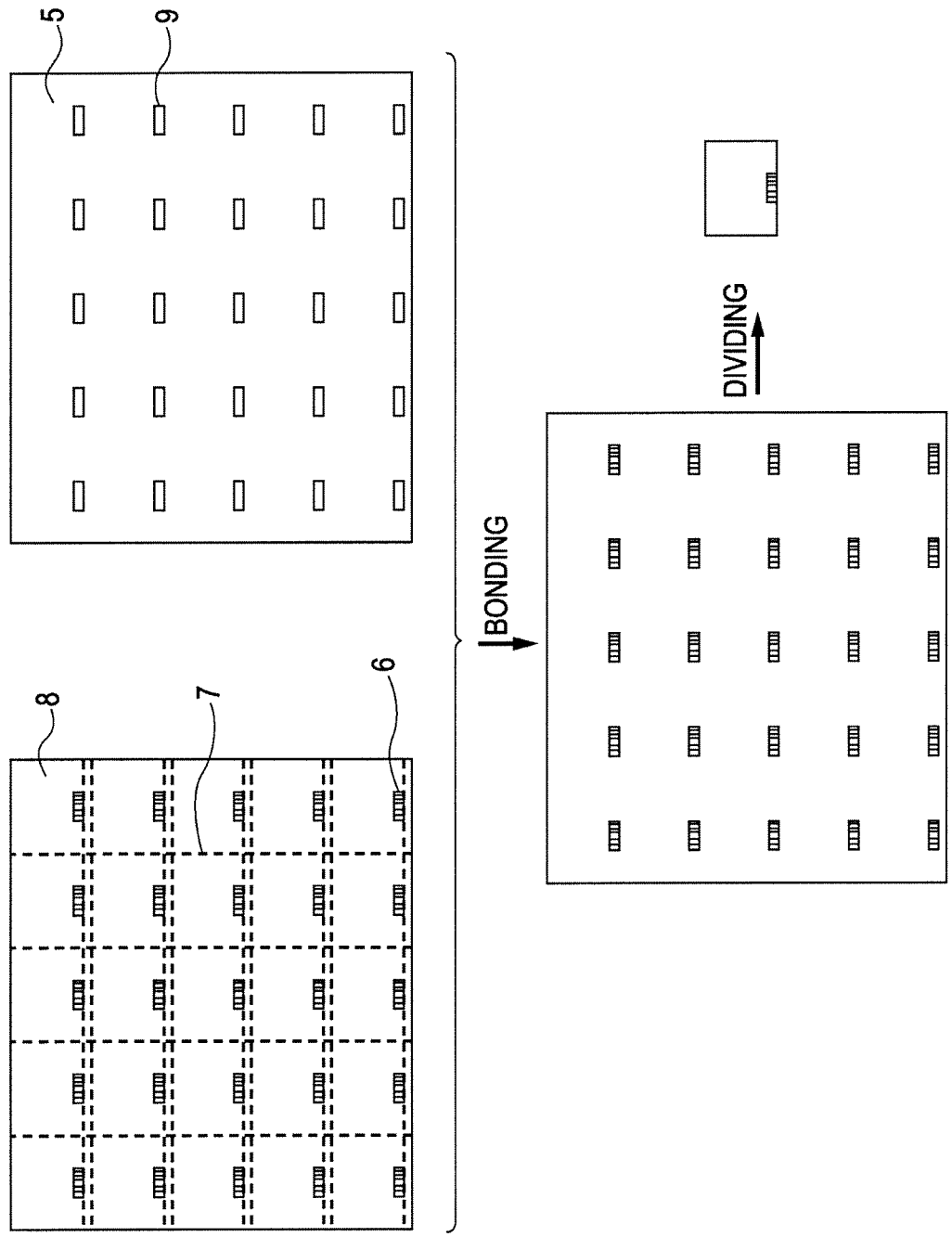

METHOD FOR MANUFACTURING ORGANIC ELECTROLUMINESCENCE PANEL

BACKGROUND OF THE INVENTION

1. Field of the Invention

The present invention relates to a method for manufacturing an organic electroluminescence panel.

2. Description of the Related Art

One of known organic electroluminescence panels has an organic electroluminescence element that is disposed on a glass substrate and that has a sandwich structure in which an organic luminescent layer is sandwiched between two electrodes. One of the two electrodes is a transparent electrode, in general, formed of indium tin oxide (ITO), to extract light from the organic luminescent layer. The outer surface of the organic luminescent layer is sealed. The organic luminescent layer emits light upon the application of a voltage by an external drive circuit.

Organic electroluminescence panels that include an organic electroluminescence element that emits light according to the above-mentioned principle have excellent legibility and produce various colors. Hence, the organic electroluminescence panels have been used in displays and display devices for use in onboard component stereo systems, mobile phones, and the like.

In a recently devised method, organic electroluminescence panels are manufactured in a multiple pattern. In this method, after organic electroluminescent components corresponding to a plurality of panels are formed on a single large substrate, the substrate is cut to manufacture a plurality of organic electroluminescence panels.

Japanese Patent Laid-Open No. 2003-249354 describes such a method for manufacturing an organic electroluminescence panel. This patent document addresses a problem which arises when cutting a substrate on which a protective layer is formed. During this severing procedure cracking or peeling of the protective layer may occur. More specifically, the protective layer is formed while a mask covers a cut line. After removal of the mask, the substrate is divided along the cut line on which no protective layer exists. The protective layer is formed to seal out water and oxygen.

However, in the method for manufacturing an organic electroluminescence panel according to Japanese Patent Laid-Open No. 2003-249354, the mask must be accurately placed on the cut line. In addition, the step of removing the mask after the formation of the protective layer complicates the manufacturing process.

To simplify the manufacturing process, a protective layer, should be formed over a plurality of organic electroluminescence element groups disposed on a large substrate, and the large substrate should be divided together with the protective layer.

BRIEF SUMMARY OF THE INVENTION

Accordingly, the present invention solves the problem that cutting or severing a protective layer may cause cracking or peeling of the protective layer, as in the Japanese Patent Laid-Open No. 2003-249354, and simplifies the manufacturing process, which is difficult to achieve in the Japanese Patent Laid-Open No. 2003-249354.

The present invention provides a method for manufacturing an organic electroluminescence panel that includes a substrate, an organic electroluminescence element group disposed on the substrate, the organic electroluminescence element group being composed of a plurality of organic electroluminescence elements, and a protective layer disposed on the organic electroluminescence element group. The method includes the steps of: placing a laminate member directly on a protective layer of a plate that includes the substrate, an array of organic electroluminescence element groups disposed on the substrate, and the protective layer disposed on the array of organic electroluminescence element groups; and cutting the substrate and the protective layer between the organic electroluminescence element groups from the substrate side.

According to the present invention, the substrate and the protective layer are cut from the substrate side while the laminate member is in contact with the protective layer. The laminate member therefore prevents cracking or peeling of the protective layer during the process of cutting the protective layer. In addition, cutting both the substrate and the protective layer in a single step can simplify the manufacturing process. Thus, the present invention produces an organic electroluminescence panel that includes a protective layer substantially free from cracking or peeling by a simple method.

Further features of the present invention will become apparent from the following description of exemplary embodiments with reference to the attached drawings.

BRIEF DESCRIPTION OF THE DRAWINGS

FIG. 3 is a schematic plan view illustrating steps of a method for manufacturing an organic electroluminescence panel according to an embodiment of the present invention.

DETAILED DESCRIPTION OF THE INVENTION

Figure 1A:
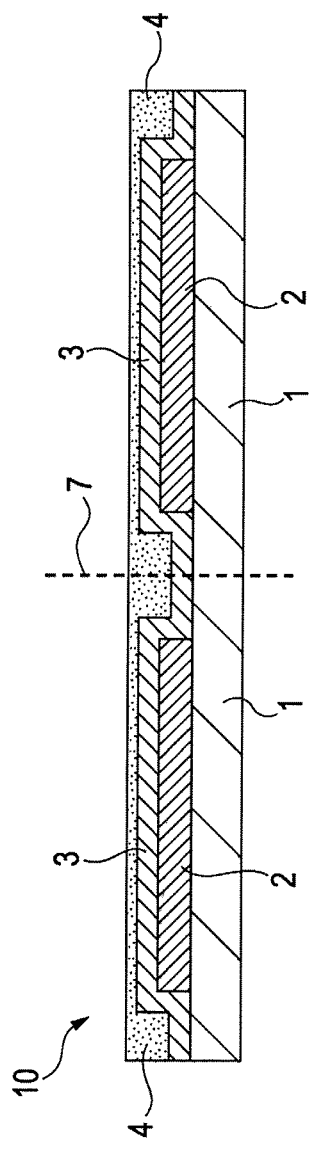
FIGS. 1A and 1B are schematic cross-sectional views illustrating methods for manufacturing an organic electroluminescence panel according to an embodiment of the present invention.

The present invention provides a method for manufacturing an organic electroluminescence panel that includes a substrate, an organic electroluminescence element group disposed on the substrate, the organic electroluminescence element group being composed of a plurality of organic electroluminescence elements, and a protective layer disposed on the organic electroluminescence element group. In this method, the substrate and the protective layer are divided between a plurality of organic electroluminescence element groups disposed on the substrate.

The method includes the steps of placing a laminate member directly on the protective layer over a plurality of organic electroluminescence element groups and cutting the substrate and the protective layer, on which the laminate member is disposed, between the organic electroluminescence element groups from the substrate side.

The laminate member disposed in contact with the protective layer immobilizes the protective layer during the process of cutting the protective layer from the substrate side. Thus, the laminate member absorbs part of the force applied to the protective layer, thereby reducing the frequency of cracking and peeling of the protective layer. This can also prevent water or other contaminants from entering the organic electroluminescence element through a crack or a peeled portion.

The organic electroluminescence panel can therefore emit light of high quality for a long time.

Furthermore, the presence of the laminate member disposed on the protective layer prevents cutting chips from adhering to the protective layer. If the laminate member is placed on the protective layer after cutting, cutting chips adhere to the protective layer. Thus, another step of removing the chips becomes necessary. If the laminate member is placed on the protective layer without removing the cutting chips, the chips cause damage to the protective layer. Furthermore, in a top-emission-type organic electroluminescence panel, in which light is extracted from the opposite side of a substrate, the chips lower the display quality greatly. A method for manufacturing an organic electroluminescence panel according to the present invention provides an organic electroluminescence panel without these problems.

The structure of an organic electroluminescence panel and a method for manufacturing the organic electroluminescence panel according to the present invention will be described below with reference to the attached drawings. FIGS. 1A, 1B, 2A, and 2B illustrate methods for manufacturing an organic electroluminescence panel according to embodiments of the present invention. FIGS. 1A, 1B, 2A, and 2B are schematic cross-sectional views and a schematic plan view of a plate to be cut. The plate 10 includes a substrate 1, an organic electroluminescence element group 2, a protective layer 3, an adhesive member (laminate member) 4, a plane member 5 in FIG. 1B, and an external connection terminal 6 in FIGS. 2A and 2B.

As illustrated in FIG. 1A, in a method for manufacturing an organic electroluminescence panel according to the present invention, the plate 10 includes a plurality of organic electroluminescence element groups 2 disposed on the common substrate 1, which is shared by a plurality of organic electroluminescence panels. The protective layer 3 is disposed over the organic electroluminescence element groups 2. The laminate member 4 is disposed on the protective layer 3. The plate is cut from the substrate side between the organic electroluminescence element groups 2 as shown by dotted line 7.

The substrate 1 is a base on which components of the organic electroluminescence element, such as a pair of electrodes and an organic compound layer disposed between the electrodes, are disposed. For example, an active-matrix organic electroluminescence panel may include a substrate 1 formed of a glass or an organic resin, a circuit element, such as a thin-film transistor (TFT), and a planarizing layer.

The organic electroluminescence element group 2 is composed of a plurality of organic electroluminescence elements. An organic electroluminescence element includes an organic compound layer disposed between a pair of electrodes. When an electric current flows from one electrode to the other, the organic compound layer emits light. In a passive-matrix organic electroluminescence panel, organic electroluminescence elements are disposed at intersection points of electrodes in a lattice pattern. A plurality of organic electroluminescence elements constitutes an organic electroluminescence element group. In an active-matrix organic electroluminescence panel, an organic electroluminescence element is composed of a pair of electrodes and a luminous organic compound layer between the electrodes. One of the electrodes is connected to a circuit element, such as TFT, that drives the organic electroluminescence element. A plurality of organic electroluminescence elements constitute an organic electroluminescence element group.

The protective layer 3 protects the organic electroluminescence elements from water and oxygen, and thereby reduces deterioration of the organic electroluminescence elements. The protective layer 3 may be formed of an inorganic substance, such as silicon oxide, silicon nitride, aluminum oxide, aluminum nitride, titanium oxide, amorphous silicon, diamond-like carbon, or SiCN. In particular, silicon nitride has excellent moisture barrier properties, excellent film-forming properties, and high crack resistance. In a top-emission-type organic electroluminescence panel, light is extracted from the opposite side of the substrate through the protective layer 3. The protective layer 3 must therefore be transparent. Since silicon nitride is slightly colored, silicon nitride may be doped with hydrogen to improve the transparency.

The protective layer 3 may have a thickness in the range of 500 to 10000 nm. The protective layer 3 having a thickness less than 500 nm cannot exhibit satisfactory moisture barrier properties, for example, because of pinholes. The protective layer 3 having a thickness more than 10000 nm may have a crack caused by external stress.

The protective layer 3 may be formed by plasma chemical vapor deposition (CVD), resistance-heating evaporation, electron-beam evaporation, or sputtering. The protective layer 3 formed of silicon nitride is generally formed by plasma CVD.

Figure 1B:
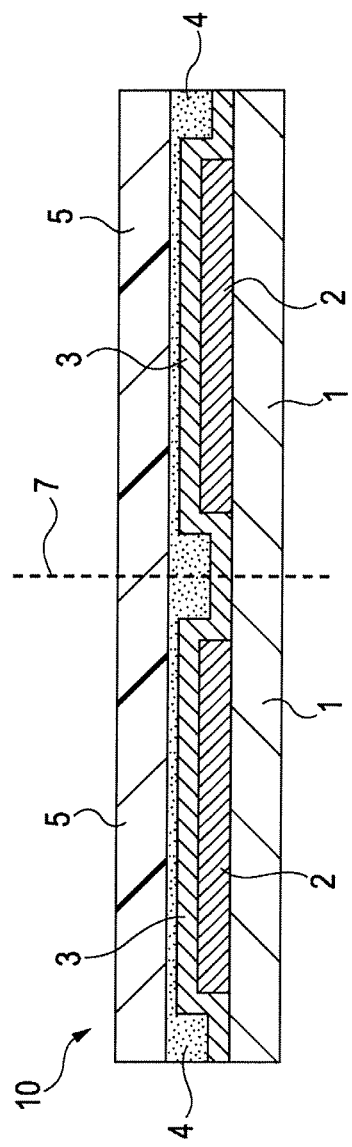

As illustrated in FIG. 1B the adhesive member 4 can be used to bond the plane member 5 to the protective layer 3. In FIG. 1A, the adhesive member 4 serves as a laminate member disposed in contact with the protective layer 3. The laminate member 4 immobilizes the protective layer 3, thereby reducing the frequency of cracking and peeling of the protective layer 3. The laminate member 4 may be formed of a less brittle material, for example, an organic resin, so as not to be split together with the protective layer 3 owing to cracking or peeling during the process of cutting the protective layer 3. Furthermore, the laminate member 4 protects the surface of the protective layer 3, for example, from a blade used for cutting. The laminate member 4 may be disposed on a side of beam extraction of the organic electroluminescence panel, or may be disposed on the opposite side of beam extraction. The laminate member 4 disposed on the side of beam extraction can prevent a large reduction in display quality due to cutting chips, as described above. While as shown in FIG. 1B the laminate member 4 is the adhesive member 4 for bonding the plane member 5 to the protective layer 3, the laminate member is not necessarily an adhesive member. The laminate member 4 may be disposed alone on the protective layer 3 without using the plane member 5.

Thus, use of the plane member 5 is another embodiment of the present invention. The plane member 5 can more securely immobilize the protective layer 3 when the protective layer 3 is cut from a side of the substrate 1. The plane member 5 may also be used as a protecting barrier for the protective layer 3, for further improvement in moisture barrier properties, and for improvement in mechanical strength and optical properties of panel products. The plane member 5 may formed of a glass or a plastic. Plastics can easily be processed to form an opening, as described below. The plastic may be a transparent plastic, such as a fluorocarbon resin, an acrylic resin, a polyester resin, a polycarbonate resin, a nylon resin, an acetylated cellulose resin, a cyclic olefin polymer resin, or a polystyrene resin. The plane member 5 may be a laminate of a plurality of materials.

The plane member 5 may be a circularly polarizing member, which reduces extraneous light reflection. The circularly polarizing member may be a laminate of a polarizing member (linearly polarizing member) and a retardation member.

Figure 2A:
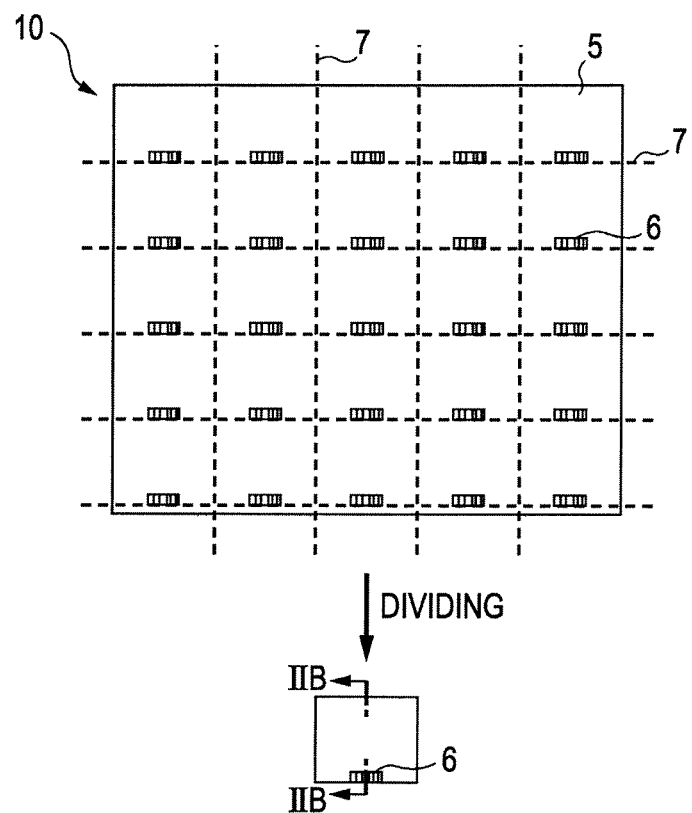
FIG. 2A is a schematic plan view illustrating a method for manufacturing an organic electroluminescence panel according to an embodiment of the present invention.
Figure 2B:
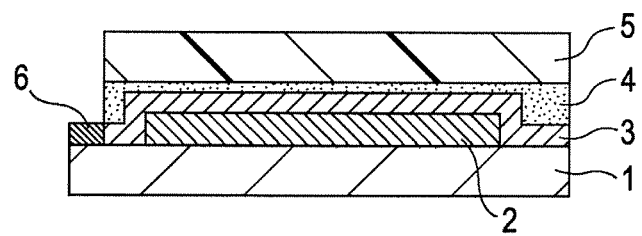
FIG. 2B is a schematic cross-sectional view illustrating a method of manufacturing an organic electroluminescence panel according to an embodiment of the present invention.

As illustrated in FIG. 2A the external connection terminal 6 is disposed on the organic electroluminescence panel, and electrically connects a drive circuit (not shown) to the organic electroluminescence panel. Input and output electric signals are transmitted to the organic electroluminescence panel through the external connection terminal 6. The external connection terminal 6 is connected to a terminal of the drive circuit, in general, a flexible printed circuit (FPC). As shown in FIG. 2B the external connection terminal 6 is disposed on the substrate 1. Thus, the protective layer 3 and the laminate member 4 should not cover the external connection terminal 6 so that the external connection terminal 6 is exposed. In other words, the laminate member 4 has an opening corresponding to the external connection terminal 6. To form the opening in the laminate member 4, the laminate member 4 is first placed on the plane member 5. The opening is then formed in the laminate member 4 and the plane member 5 at a position corresponding to the external connection terminal 6. The laminate member 4 and the plane member 5 each having the opening are then placed on the protective layer 3. These procedures can significantly simplify the manufacturing process, as compared with the procedures in which an opening is formed after the laminate member 4 is placed on the protective layer 3.

A method for manufacturing an organic electroluminescence panel according to the present invention will now be described in detail with reference to FIG. 3. In FIG. 3, reference numeral 8 denotes an organic electroluminescence board, and 9 denotes an opening. The term "organic electroluminescence board" as used herein refers to a board that includes a substrate and an organic electroluminescence element disposed on the substrate, and optionally a protective layer, a laminate member, and other members. First, as shown in FIGS. 2A and 2B a plurality of organic electroluminescence element groups is formed on a glass substrate 1 with a film-forming apparatus, such as a deposition apparatus or a spin coater. Each of the organic electroluminescence element group is composed of a plurality of organic electroluminescence elements. Each of the organic electroluminescence elements is composed of a pair of electrodes and an organic compound layer disposed between the pair of electrodes. A protective layer 3 is then formed on the organic electroluminescence element groups.

As shown in FIG. 3 a plane member 5 that has an opening 9 corresponding to an external connection terminal 6 for input and output electric signals is bonded with an adhesive member 4 to the substrate 1, on which the organic electroluminescence element groups 2 are disposed. The external connection terminal 6 is to be connected to a flexible printed circuit (FPC). An adhesive may be applied to the plane member 5 as the adhesive member 4. The plane member 5 is then bonded to the substrate 1, on which the organic electroluminescence element groups 2 are disposed, by roll lamination or vacuum lamination. If necessary, the plane member 5 is bonded to the substrate 1 under the application of heat. Furthermore, the bonded product may be heat-treated under pressure to remove air bubbles in the adhesive member 4.

The bonded product is divided into panels along the cut line 7. The term "dividing" as used herein includes cutting an object with a dicer or a cutter, cutting a surface of an object with a scriber and subsequently splitting the object under pressure, and cutting an object with a laser. A glass may be cut with a diamond cutter or a laser. A plastic may be cut with a cutting edge or a punching blade. Any appropriate dividing procedure may be employed.

In the present invention, the substrate 1 and the protective layer 3 are cut from the side of the substrate 1, because the laminate member 4, which is not cut yet, immobilizes the protective layer 3 during the process of cutting the protective layer 3. A dicer can cut not only the substrate 1 and the protective layer 3, but also the laminate member 4 and even the plane member 5. When a glass scriber is used, the surface of the substrate 1 is cut with a glass scriber, and then pressure is applied to the laminate member 4 to split the substrate 1 and the protective layer 3. Because the laminate member 4 is difficult to split, the laminate member 4 may be cut together with the plane member 5 with a dicer or a cutter from a side of the plane member 5.

When the plane member 5 and the laminate member 4 are cut from the side of the plane member 5, the cut line may not be in line with that from the side of the substrate 1. However, it is preferred that the cut line from the side of the plane member 5 is in line with that from the side of the substrate 1.

Finally, the external connection terminal 6 is connected to an FPC with an electroconductive adhesive, such as an anisotropic electroconductive adhesive, to complete an organic electroluminescence panel.

EXAMPLE

A method for manufacturing an organic electroluminescence panel according to the present invention will be described in detail with reference to an example. However, the present invention is not limited to the example, and various modifications may be made within the gist of the present invention.

Example 1

An embodiment according to the present invention will be described below with reference to FIG. 3.

[Planarizing Film]

An acrylic planarizing film was formed by photolithography on a glass substrate, on which TFT circuits of a plurality of panels were disposed, to flatten recessed and raised portions due to the TFT circuits.

[Formation of Chromium Electrode]

A chromium film having a thickness of 100 nm was deposited as an anode on the planarizing film by direct-current sputtering of a chromium target. The chromium film was formed as a pixel electrode 20 μm×100 μm in size using photolithography. The sputtering was performed in an atmosphere of argon at a pressure of 0.2 Pa and an electric power of 300 W.

[Open to the Atmosphere]

The specimen was removed from the sputtering apparatus, was subjected to ultrasonic cleaning in acetone and then isopropyl alcohol (IPA), was washed in boiling IPA, was dried, and was subjected to UV/ozone cleaning.

[Device Isolation Film]

A device isolation polyimide film was formed by photolithography to separate each element.

[Pretreatment]

The specimen was transferred into an organic electroluminescence deposition apparatus, which was then evacuated. A 50 W radio frequency (RF) power was applied to a ring electrode in the vicinity of the substrate in a pretreatment chamber to perform oxygen plasma cleaning. The oxygen plasma cleaning was performed at an oxygen pressure of 0.6 Pa for 40 seconds.

[Formation of Positive-Hole Transport Layer]

The specimen was transferred from the pretreatment chamber to a deposition chamber, which was then evacuated to $1\times10^{-4}$ Pa. Tris(8-hydroxyquinoline)aluminum(III) (Alq3)/ N,N'-Di-[(1-naphthyl)-N,N'-diphenyl]-(1,1'-biphenyl)-4,4'-diamine (αNPD), which can transport a positive hole, was deposited by resistance-heating evaporation at a deposition rate in the range of 0.2 to 0.3 nm/s to form a positive-hole transport layer having a thickness of 35 nm. The positive-hole transport layer, a luminescent layer, and an electron-injection electrode layer were deposited using the same mask at a predetermined portion where the chromium pixel electrode was exposed on the substrate.

[Formation of Luminescent Layer]

An alkylate complex Alq3 was subsequently deposited on the positive-hole transport layer by resistance-heating evaporation under the same conditions as those in the formation of the positive-hole transport layer. A luminescent layer having a thickness of 15 nm was formed.

[Formation of Electron-Injection Electrode Layer]

Alq3 and cesium carbonate ($Cs_2CO_3$) were deposited on the luminescent layer by resistance-heating coevaporation while the deposition rates of Alq3 and cesium carbonate were adjusted so that Alq3 and cesium carbonate were mixed at the film thickness ratio of 9:1. An electron-injection electrode layer having a thickness of 35 nm was formed. More specifically, Alq3 and cesium carbonate in their respective vapor deposition boats were evaporated by resistance heating. The electric current of each boat was adjusted so that a film was formed at a total deposition rate of 0.5 nm/s. The positive-hole transport layer, the luminescent layer, and the electron-injection electrode layer constituted an organic electroluminescent layer.

[Formation of Cathode (Transparent Conductive Layer)]

The specimen was transferred to another deposition chamber. An ITO cathode having a thickness of 130 nm was formed on the electron-injection electrode layer by direct-current magnetron sputtering using an ITO target.

[Formation of Protective Layer]

Finally, a silicon nitride film having a thickness of 1 μm was deposited on the cathode as a protective layer by plasma CVD, while electrode pads to be connected to an FPC in a mounting process described below were masked to prevent the formation of a silicon nitride film. The silicon nitride film covered the entire surface of a plurality of panels.

The organic electroluminescence board 8 thus produced was composed of the glass substrate, on which TFT circuits were disposed, the planarizing film, the anode, the device isolation film, the positive-hole transport layer, the luminescent layer, the electron-injection electrode layer, the cathode, and the protective layer.

[Bonding of Circularly Polarizing Member]

An adhesive circularly polarizing member had openings 9 corresponding to the electrode pads. The openings 9 were formed by punching. The adhesive circularly polarizing member was bonded to the organic electroluminescence board 8 with a roll laminator, while aligning the openings with the electrode pads. The organic electroluminescence board 8 was then heated in an autoclave at 50° C. and 0.2 MPa for 10 minutes to remove air bubbles in the adhesive.

[Dividing]

The organic electroluminescence board 8 that included a plurality of panels was cut from the substrate side with a precision glass scriber equipped with a diamond rotary blade. The circularly polarizing member and the adhesive were cut with a cutter. Thus, the plurality of panels was divided into individual panels.

[Mounting]

Finally, an FPC was mounted. The FPC was to be connected to a drive circuit for driving an organic electroluminescence panel. More specifically, the FPC was bonded to an external connection terminal of an organic electroluminescence panel by heat press bonding using an anisotropic conductive film.

<Evaluation>

Ten organic electroluminescence panels were produced by the above-mentioned process. The observation of the sections of the panels with an optical microscope showed that cracking and peeling did not occur in the protective layers. After a high temperature and high humidity test at 60° C. and 90% RH for 1000 hours, visual inspection and observation with an optical microscope identified no problem in appearance. Furthermore, after the high temperature and high humidity test, no abnormality was observed in the luminescence properties of the organic electroluminescence panels evaluated by applying a voltage between the anode and the cathode.

COMPARATIVE EXAMPLE

An organic electroluminescence board that included from a substrate to a protective layer was produced in the same way as in Example 1. The organic electroluminescence board that included a plurality of panels was cut from the substrate side with a precision glass scriber equipped with a diamond rotary blade. Thus, the plurality of panels was divided into individual panels.

An adhesive circularly polarizing member was then bonded to a panel in the right place with a roll laminator. The panel was then heated in an autoclave at 50° C. and 0.2 MPa for 10 minutes to remove air bubbles in the adhesive. Finally, an FPC was bonded to an electrode pad as in Example 1.

<Evaluation>

Ten organic electroluminescence panels were produced by the above-mentioned process. The observation of the sections of the panels with an optical microscope showed that a crack and a peeled portion having a length of up to about 0.5 mm extending from a cut surface appeared in the protective layer. After a high temperature and high humidity test at 60° C. and 90% RH for 1000 hours, visual inspection and observation with an optical microscope showed that the crack extended into the panel. After the high temperature and high humidity test, the luminous efficiency was reduced because of deterioration of organic electroluminescent layers of pixels in an outer area of the panel. A portion of the pixels did not emit light.

Furthermore, a non-luminous region was observed in a panel, independently of a crack in a cut surface. Observation of the non-luminous region in the panel showed that a foreign substance, probably cutting chips produced by cutting, adhered to a portion between the circularly polarizing member and the protective layer. The foreign substance was pressed against the protective layer when the circularly polarizing member was bonded to the panel. This caused a crack in the protective layer, thus producing the non-luminous region.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2007-057244 filed Mar. 7, 2007, which is hereby incorporated by reference herein in its entirety.

What is claimed is:

1. A method for manufacturing an organic electroluminescence panel comprising the steps of:
providing a plate that includes a substrate, an array of organic electroluminescence element groups disposed on the substrate, each organic electroluminescence element group comprising a plurality of organic electroluminescence elements, and a protective layer disposed on the array of organic electroluminescence element groups;

placing a plane member with a laminate member on the protective layer of the plate and on a cut line set between the organic electroluminescence element groups, and cutting the substrate and the protective layer along the cut line from the substrate side with the laminate member being disposed on the protective layer of the plate and on the cut line, and with the plane member disposed on the laminate member of the plate and on the cut line.

2. The method for manufacturing an organic electroluminescence panel according to claim 1, wherein the laminate member is disposed on a side of beam extraction of the organic electroluminescence elements.

3. The method for manufacturing an organic electroluminescence panel according to claim 1, further comprising the step of cutting the plane member and the laminate member between the organic electroluminescence element groups from the plane member side.

4. The method for manufacturing an organic electroluminescence panel according to claim 1, wherein the organic electroluminescence panel has an external connection terminal, and the step of placing the laminate member comprises the substeps of:

forming an opening for the external connection terminal in the plane member and the laminate member; and placing the laminate member and the plane member each having the opening on the protective layer.

5. The method for manufacturing an organic electroluminescence panel according to claim 1, wherein the plane member is a circularly polarizing member.

6. The method for manufacturing an organic electroluminescence panel according to claim 1, wherein the step of placing the plane member with the laminate member on the protective layer comprises the substeps of:

placing the laminate member on the plane member; and placing the plane member over the protective layer such that the laminate member comes into contact with the protective layer.

* * * * *